United States Patent [19]

Aish

[11] 4,275,449

[45] Jun. 23, 1981

[54] MODELLING ARRANGEMENTS

[75] Inventor: Roslyn R. Aish, Winchester, England

[73] Assignee: National Research Development Corporation, London, England

[21] Appl. No.: 34,667

[22] Filed: Apr. 30, 1979

[30] Foreign Application Priority Data

Apr. 28, 1978 [GB] United Kingdom ............... 16930/78

[51] Int. Cl.³ ...................... G06F 13/00; G09B 25/04
[52] U.S. Cl. ................................... 364/512; 364/518; 364/900; 434/72; 434/365
[58] Field of Search ............... 364/512, 800, 801, 200, 364/900, 515, 518; 35/49-53; 340/723, 724, 732, 734

[56] References Cited

U.S. PATENT DOCUMENTS

| | | | |
|---|---|---|---|
| 3,867,616 | 2/1975 | Korelitz et al. | 364/512 |
| 3,927,948 | 12/1975 | Cox et al. | 364/512 |

FOREIGN PATENT DOCUMENTS 1119574   7/1968   United Kingdom ..................... 364/512

OTHER PUBLICATIONS

Sorte, G. J. "Methods for Presenting Planned Environment"; Man-Environment Systems; vol. 5, No. 3 (1975); pp. 148-154.

"PSSHAK Makes It at Last"; Architects Journal, 10/12/77, pp. 692-693.

Fleming et al.; CAD Education in Architecture; Prog. of Int. Conf. Computer Aided Design Education; IPC (1978), London.

Primary Examiner—Errol A. Krass
Attorney, Agent, or Firm—Cushman, Darby & Cushman

[57] ABSTRACT

A collection of modelling elements having distinct forms and changeably interengageable for assembly to one another. Each element includes information stores and signalling paths via which said stores are connected in an information transfer network to engaged elements. The information store contents are machine readable via an entry to the network and the way in which the elements have been assembled is detectable from the machine readable contents. The elements can represent constructional features, such as parts of a building, and the physical characteristics of a building of desired appearance represented by a particular assembly can be worked out and displayed from the way in which the representational elements have been assembled.

40 Claims, 8 Drawing Figures

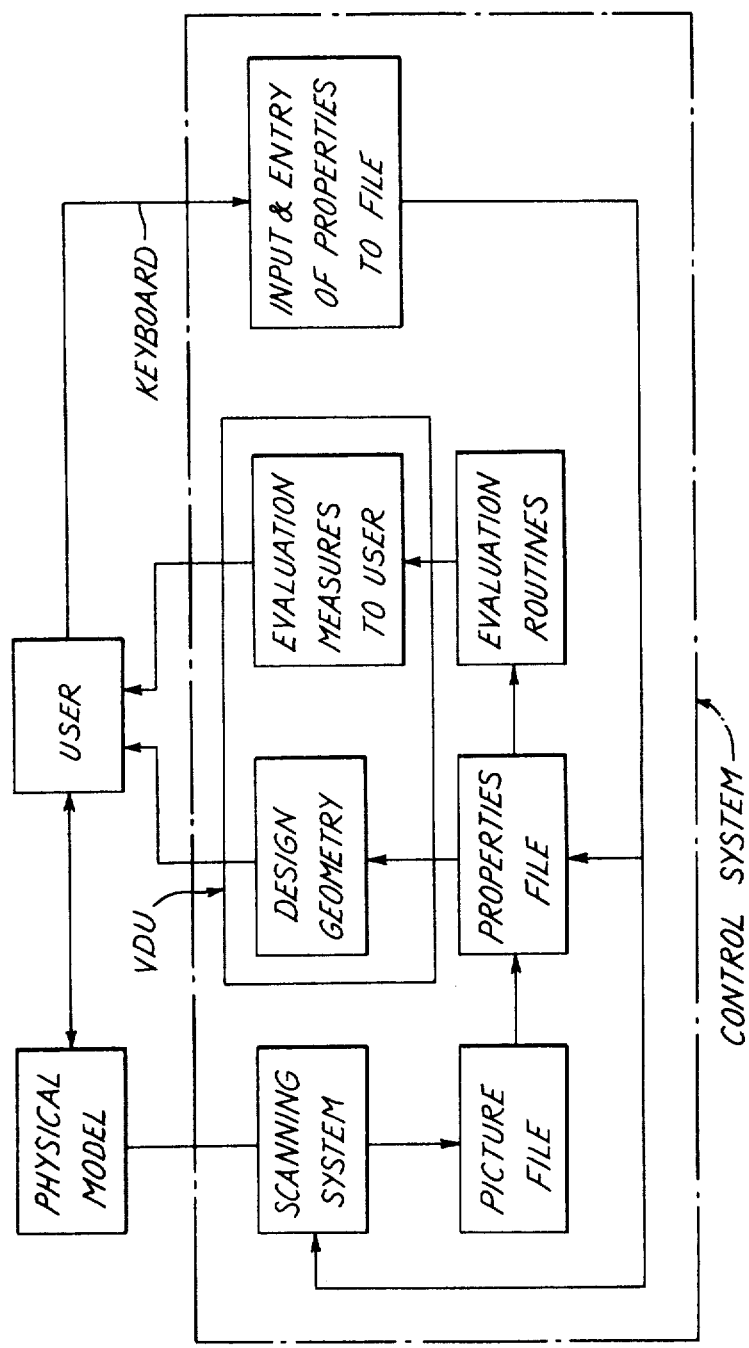

MODELLING ARRANGEMENTS

BACKGROUND OF THE INVENTION

This invention relates to a modelling arrangement particularly but not exclusively useful as a design aid to architects, consulting engineers and other professional designers and their clients.

For many years models have been used to assist a designer and client to decide the finished appearance of a building, ship, process plant, room and the like. Such models are representational only and deal with the parts of the design which appeal to the eye. One recent example of such models is the PSSHAK system, described in Architects Journal, Oct. 12, 1977, pages 692-693, London, in which the client can model a desirable building layout of rooms and fittings using 3-dimensional scale models.

Such systems have value and can help the designer and client to achieve a better design. An analysis of the various aids now available is in Sorte, G.J., Methods for presenting Planned Environments, Man-Environment systems Vol. 5, No. 3, (1975) pp 148-154. One conclusion of this analysis is that a 3-dimensional physical model is probably the most suitable design analog and therefore the most useful aid at the designer/client interface.

In recent years Computer Aided Architectural Design (CAAD) systems have been developed. Typically in such a system floor plans are displayed on a cathode-ray tube screen and adjusted by the designer in accordance with the client's proposals. Such plans are two-dimensional and are not always easy to relate to an actual construction. Usually the system can calculate and display the performance of the design from supplied parameters. One recent example of CAAD is the PARTIAL system described in CAD Education in Architecture, Proc. of Int. Conf. Computer Aided Design Education (CAD ED) IPC (1978) London.

Thus a physical 3-dimensional scale model is the easiest for the lay client to use. However such models are the most expensive to build, slowest to make and most difficult to alter. Also the model is not easily linked to the calculating facility in a computer.

Furthermore the model does not in any way relate to the structure or performance of the actual designed product, as the model is made usually of card and wood rather than brick, glass, steel and concrete.

SUMMARY OF THE INVENTION

Accordingly there is a need for a modelling arrangement which is readily understood by the lay client but which also provides useful information to the professional designer in a readily usable form.

It is an object of the invention to provide a modelling arrangement which models both the representational aspects and the physical properties of an actual construction in accordance with the modelled form.

According to the invention there is provided a modelling arrangement of a quantity of changeably interengageable representational elements for selective assembly to model the visible form and related physical properties of a building, room, ship, process plant and like construction. Each of said elements has a distinctive form appropriate to a part of said construction; an information store to store, for recovery by machine reading, information linked with a physical property of said modelled part; and element portions to provide interengagements with other elements. The element portions also include signal transfer means to connect the stores of several selected elements together to form a selectively operable extensive network as a machine readable model of the collective physical properties of the representationally modelled construction.

According to another aspect of the invention there is provided a modelling arrangement of a quantity of changeably interengageable elements, some at least being of forms distinct from others, for selective assembly together. Each element also including information storage means to store machine readable information identifying its respective distinctive form. The elements also have portions to provide interengagements with other elements and information transfer means effective to transfer stored information from element to element, whereby the interengaged elements provide a linked information transfer network for the transfer of machine readable information indicating the arrangement of the interengaged elements.

The elements may be arbitrary shapes such as geometric solids.

The elements described above may include internal information transfer paths whereby information supplied to one element can be passed through said one element to another interengaged element. A first element may include means responsive to the interengagement of a second element to condition the first element to supply information, in reply to an external demand made to the first element, that said second element is connected thereto.

The information store of an element may be an electrical arrangement. The stored information may only indicate the type of constructional part represented by the element, such as outside wall with a single-glazed window areas, or may record actual physical properties of the constructional part represented by the element, such as size, weight, heat loss, and electrical requirement. Th circuit arrangement may be accomplished through manually set switches or a microcircuit permanently or temporarily storing the required identity or property information. The element may include a display of the information stored.

The arrangement may include a base onto which the element may be assembled in a signal transfer relationship with the base and at least some neighbours. Instead of a base, a single element can provide a connection point for an assembly of elements.

The arrangement may include a control means providing a control, store and display unit to record the form of an assembly, and may further include a computer aided design system to determine the overall behaviour of the assembly and record and/or display this behaviour and other data and drawings. The control unit may be arranged to respond to modifications in the assembly, which may change its appearance, to indicate the effect of such changes on the cost, energy consumption, floor area and the like properties of the structure modelled by the assembly. The control unit may be connected to the base.

The structures modelled may be the whole or part of a building, plant, ship, aircraft and the like.

Alternatively the modelling arrangement may permit the assembly of shapes into a layout which can be recorded directly by a machine from the network of element stores.

BRIEF DESCRIPTION OF THE DRAWINGS

Embodiments of the invention will now be described with reference to the accompanying drawings in which:

FIG. 8 shows a schematic of a design aid in accordance with the present invention.

DETAILED DESCRIPTION OF THE PREFERRED EXEMPLARY EMBODIMENTS

Figure 1:
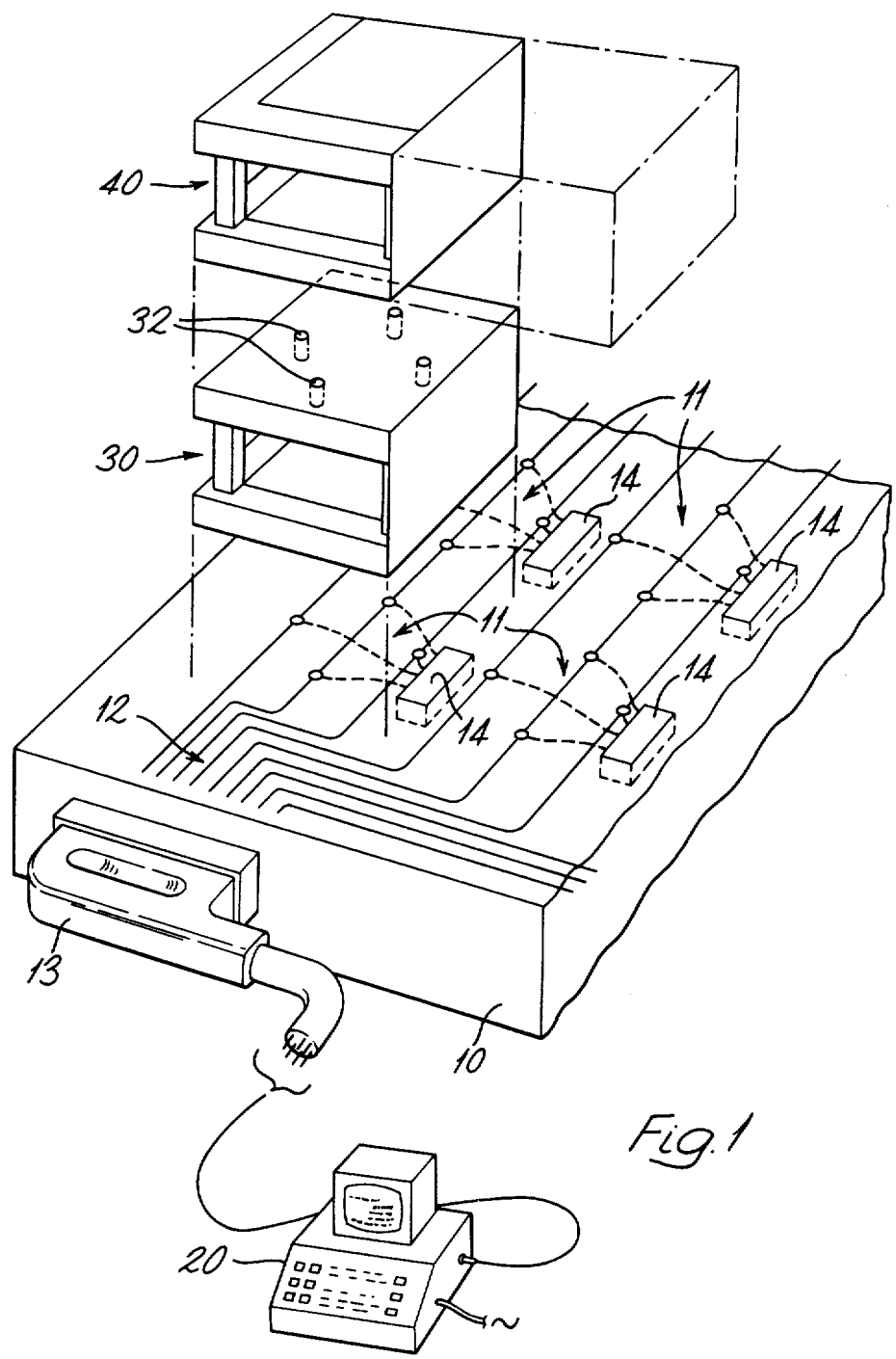
FIG. 1 shows a schematic outline of an assembly of elements fitted on a base board which is connected to a control and display device, in accordance with the present invention.
Figure 5:
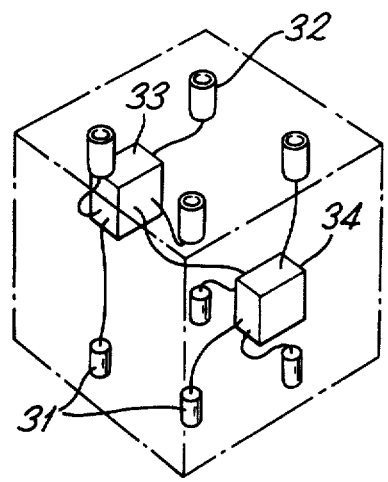

In FIG. 1 a base board 10 is provided with a plurality of similar electrical connector-part sets 11 which also provide mechanical location. The connector sets are connected to a wiring layout 12 providing several parallel connector runs and extending to a multiway connector and cable 13. The multiway cable extends to a control console such as a VDU and keyboard 20 arranged with a computer device inside it. Individual elements such as 30, 40 are provided with plugs 31 on their underside (FIG. 2) compatible with the connector-part sets 11 of base 10. Each set 11 has an associated electric circuit module 14, described later, and each element has an internal module or modules 33, 34, for example, as shown purely symbolically in FIG. 5.

The form and appearance of the elements is chosen with reference to the construction to be modelled so as to represent specific visual and physical properties. For example a set of elements modelling the multi-storey block type of building may be provided. The various elements could then each represent a portion of the block including the visible features of window and wall areas, roof, parapets, entrances, basements and the like while the physical properties appropriate to each element identity are also provided either in tabular form for computer recovery and allocation to an element chosen to have them or actually stored in a suitable circuit in the respective element. Another set of elements could represent domestic buildings such as houses, flats and the like while other sets could represent ships and process plant, all including the appropriate physical property detail in or associated with individual elements.

In use, the elements are assembled by plugging one into another to build a desired constructional form as a model. The assembled elements are then interrogated by suitable electronic control means over their plug connections to determine the arrangement of the elements. From this information suitably arranged calculating equipment can determine the physical properties of the desired constructional form as a whole and display the information for assessment by the designer and client. In one or more of these physical properties, which include cost, ground loading, floor area or heat loss, is unacceptable, the model form can be adjusted and the effect of the adjustment quickly observed as a change in the overall physical property determined by the calculating equipment.

Many ways in which the electronic circuitry and calculating equipment can be constructed will be apparent to those skilled in the art, using devices and techniques of integrated circuits, permanent or transient solid state memories, magnetic tape, disc or bubble memories, and microprocessors, data transmission and signal processing and computer aided design systems. By way of example one way will be outlined with reference to FIGS. 1, 6, 7 and 8.

FIG. 1 shows a baseboard 10 into which elements such as 30, 40 can be plugged to represent respectively one floor portion and one roof portion of a multistorey building. Other elements (not shown) are added on the base board and in upper layers to model the whole building. A wiring layout or circuits 12 connects together the connector-part sets 11 into which elements are plugged, and connections within the elements extend supply lines such as V+, V− from connector sets 11 into an element via connectors 31 and also provide connections for further elements (see FIG. 6) via connectors 32. Signal connections, such as SIG, are also provided in circuits 12 but these are generally not continuous through the elements, as is described later. The wiring layout 12 extends to a connector 13 as described above.

Figure 6:
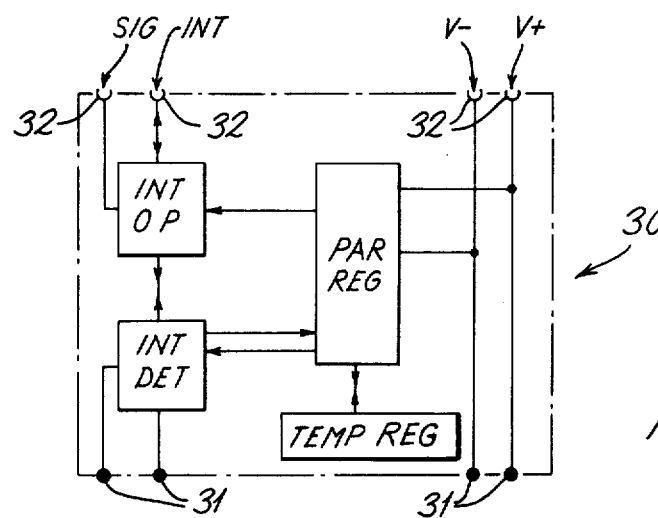
FIGS. 6 and 7 show in block diagram from the electronic circuit functions of an element and a base board of FIG. 1 respectively.
Figure 7:
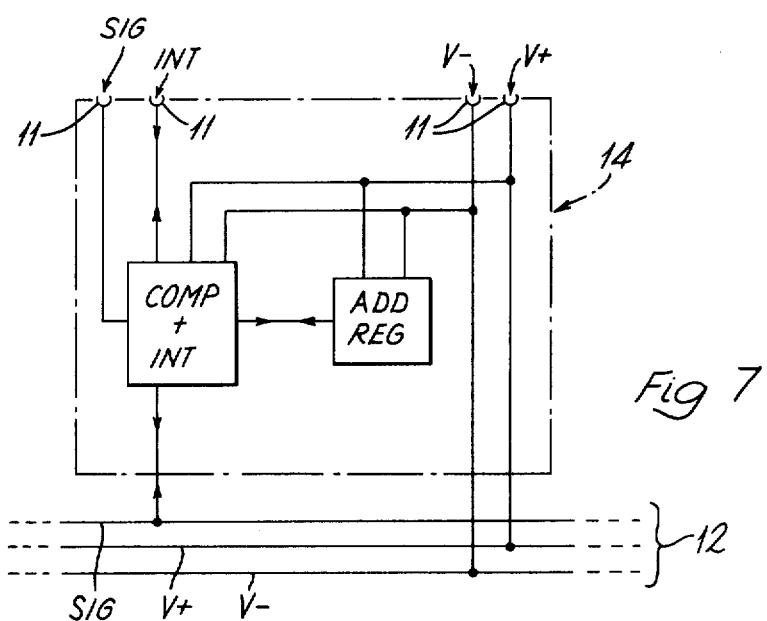

The baseboard electric circuit module 14, in one possible form, is shown in FIG. 7. The purpose of this module is to provide to the control console 20 an indication that an element is connected at the respective position on the base board 10 and to form a path through which information passes to and from such elements. The module 14 includes two main parts, an address register ADD REG and a comparator and interrogator COMP+INT. Each module 14 has a different address held, either permanently or temporarily as is well known, in the register ADD REG. In operation the control console 20 can be instructed by an operator to start to examine each address in turn to determine whether or not elements are present. Thus a series of addresses are then supplied to path SIG of circuits 12 by console 20. The first address will reach all modules 14 connected to SIG but only one module 14 will have the same address in its register ADD REG. The comparator COMP+INT of this module will detect the correspondence of the address on path SIG and the address in register ADD REG and respond to the control console in any suitable manner, as is well known in signal-processing techniques. The comparator is further effective to determine whether or not an element is connected at the respective connector. This action is via path INT. If an element is not so-connected then path INT provides an open-circuit and the module part COMP+INT detects this condition and signals to the control console accordingly so that the information can be noted for the particular element arrangement in use. If an element is present the path INT is not open-circuit and a path to the upper element will exist. Assuming that the element is as shown in FIG. 6 the element circuit part INT DET is connected to module part COMP+INT and a response provided. This response enables part COMP+INT to signal the control console that an element is present.

The exemplary element in FIG. 6 contains various electronic circuit parts. Three main ones are the interrogation detector INT DET, the interrogation repeated output INT OP and the parameter register PAR REG. An optional part TEMP REG is a temporary register usable in various ways described below.

Returning to the examination of the assembly, once the console is signalled that an element is present at an address of a connector 11, further signals are exchanged via parts COMP+INT and INT DET to determine the form of element and its properties and identity. This enables the console to determine the electronic network produced by an arrangement of elements by a step-by-step examination of the base board. As further elements may be connected on top of the element on the base board each element in turn can be instructed to carry out an interrogation step similar to that of module 14, using parts INT DET and INT OP. No address comparator is needed as this is provided in module 14. In this way the order in which elements are assembled above a specific connector 11 on the base board can be derived and recorded in the control console, together with their properties and identities. Once element part INT DET of the lowest element has operated to satisfy the control console then it is enabled to activate element part INT OP to determine whether or not a further element is present above it and then supply any required information. This procedure is repeated until the topmost element is reached, when the interrogation is moved onto the next base board position. Thus the whole arrangement of elements can be recorded in the control console by a procedure controlled by the console in conjunction with the element responses. When the whole element arrangement is thus recorded, the overall physical properties of the construction can be calculated and displayed as described above.

FIG. 8 shows in schematic form the calculation and display stage. The physical model of elements representing the visual aspects of the desired design have been scanned by a scanning system brought into action by the user, e.g. via the keyboard, to create a picture file which is an electronic representation of the network of element information stores and therefore of the element arrangement. Thus the machine (control console) has scanned and read the arrangement directly. The picture file is drawn on by the calculating equipment in the console, or associated with it if a separate computer is used, to cooperate with the properties file and evaluation routines to generate a display of the physical characteristics and performance of the element arrangement. If required the user can enter changes to the properties files and evaluation routine during use of the equipment to see whether rearrangement of the elements or alteration of specific assigned physical properties is more likely to achieve a desired overall design. For example, single glazing may be replaced with double glazing.

To speed the response of the arrangement when elements are moved the temporary register TEMP REG can be used to retain the information that the element has been interrogated and remains in position. By arranging for the temporary register to be erased when the supplies V+, V− are removed on unplugging, an element rearranged and an added element can be detected, speeding the response of the control console.

As described above one baseboard unit is used. However if required one or more sub-baseboards may be used and these may be linked to each other or even mounted on the main baseboard in a suitable relationship. Clearly if required the baseboard surface can be tilted or regarded as tilted, even being a horizontal surface modelling a vertical one.

The elements may be linked together in chains. This technique is particularly suitable when the modelling arrangement uses elements which represent shapes such as geometric solids rather than actual constructional parts. The elements can be shaped and coloured in different ways which shapes and colours are recorded in the respective element stores. Elements of this type can be used for asessment of creative skills and mental activity, for example as aptitude tests or rehabilitation aids and checks. As the manner in which the elements are arranged is machine readable, the tests can be carried out without the full-time supervision of a skilled operator as the machine records can be examined as required.

The interaction between the modelling arrangements embodying the invention and the user or operator can be increased in that the control console can be caused to identify an element to be moved or used or even, with a suitable mechanical device, caused to move such an element itself.

The store, whether electrical/electronic or or any other type, such as optical or magnetic, in an element can be removed as a unit from the element shell for alteration or replacement. In this way fresh elements can be produced by a user with new shells, without the need to acquire new stores. The stores can have information written into them before or after insertion in an element shell. Clearly the nature of the stored information can be varied as desired.

Another form of interrogation is now described. As mentioned above further elements can be interrogated through a first element. If desired an address may be associated with an element rather than a baseboard position. The element includes an address register similar to ADD REG of module 14 (FIGS. 1 and 7). The interrogation by the control console establishes the address of the element at a particular baseboard position, e.g. in XY coordinates, and thereafter uses the element address rather than the XY coordinate position. The control means then addresses this element to interrogate and recover the address of an element engaged with the first element. This action is repeated until all engaged elements have been examined. The address of an element may be formed wholly or partly by the stored information on type or physical properties. In one form the XY locations can be determined by the intersections of an orthogonal wire array. Communication between elements and through elements can also be on the element address basis.

Figure 2:
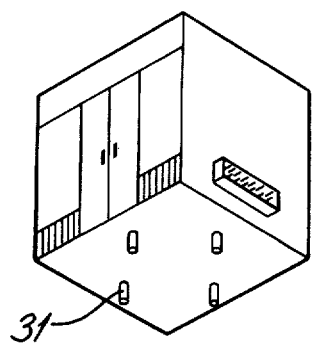
FIGS. 2, 3, 4 and 5 show various elements features which may be put together in combination in actual elements.
Figure 3:
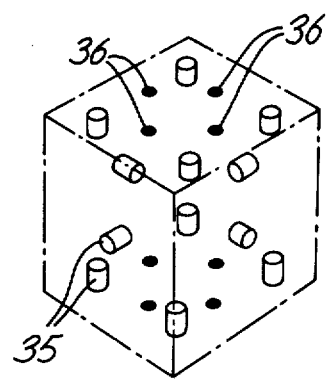
Figure 4:
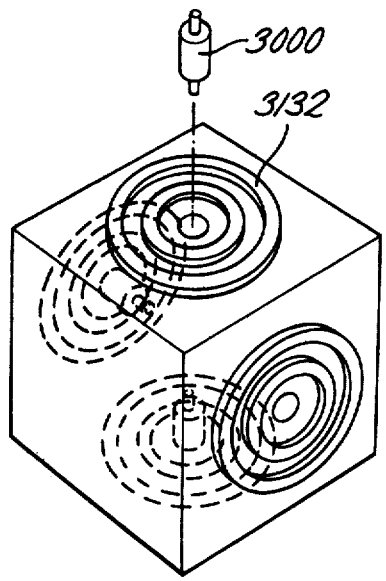

The elements described so far have had connections only on upper and lower opposed faces. FIG. 4 shows an example of an element with connectors on side faces as well. These connectors are arranged to permit the elements to be joined together in other than a rectilinear pattern as one element can be twisted on an axis through the other. Concentric conductor rings 3132 provide contacts despite the twisting. Item 3000 is a coupling and pivoting element which can also provide electrical connections if needed. FIG. 3 shows an element which is held in place by magnets 35 embedded in the faces and contact made by metal studs 36 brought together when the faces are held together by the magnets. Clearly the various element forms and features of FIGS. 1 to 5 can be used in various combinations in addition to those specifically shown. The shape of elements need not be cuboid and can even model an object such as a part of a process plant.

As described above elements were stacked one above the other with vertically extending electrical connections. If required connections can extend sideways to enable elements to model balconies, voids and suspended features. To assist in identifying the resulting branches in the modelling electrical network the temporary register TEMP REG can be used. Alternatively dummy elements might be used to fill the voids and extend connections from the base board without impairing the correctness of the model.

The elements can include more complex electrical circuitry and registers to retain more details about the modelling action of the element and provide other facilities. Such details could include the identity of the element in the set in use; for example when several element faces have connections, some could be selectively switched off by suitable signals. The electronic techniques to achieve these results are readily apparent to or devisable by those skilled in the art from those now available. Integrated and discrete circuits and devices readily provide the switching devices and logic functions usable in producing such elements.

As described so far the elements are plugged into a base board provided with circuit modules at each plug position. To increase flexibility these modules may be omitted and the elements arranged to respond more fully for example with individual addresses as described above. The baseboard is wired so that the control console can address a selected board location identified in XY or other suitable coordinates, e.g. polar for a cylindrical structure. (In a further form one or more elements is provided with a direct connection to the control console and the baseboard can be omitted; FIG. 2 shows such an element with a multiway connector). The element connected at the XY location is arranged to perform logical mathematical or other operations on a signal received from the control console. Conveniently such a signal may be a sequence of data bits such as ONES and ZEROS.

The operation of an element in this way is now described by way of example only with reference to a further embodiment.

The control unit transmits a sequence of logical ONES. In a register in the element are stored a pattern of ONES and ZEROS which have been assigned as the identifier of this particular element. The element includes an 'AND' gate as a logical device. The sequence of ONES transmitted by the control unit is 'ANDed' with the sequence of ONES and ZEROS in the element register. The logical product of this operation is a sequence of ONES and ZEROS identical to the sequence of ONES and ZEROS in the element register. This product of the logical operation is transmitted back to the control unit. Alternatively the control unit may transmit a sequence of clock pulses where for example the Nth clock pulse causes the Nth bit in the element register to be transmitted to the control unit. Other messages may be transmitted to the element, operated on by devices within the element and transmitted back to the control unit to test the communications between the control unit and the element, to provide error checking on other messages transmitted or received or to perform other functions.

The number of bits in the element register is variable and depends on the number of different classes of elements which must be uniquely identified, whether each member within each class of element also needs to be uniquely identified, and whether each location feature on the element by which the control unit may have assessed the elements identifier also needs to be uniquely identified.

The bit pattern in the element register may be restored by the control unit transmitting the bit pattern back to the element, by reloading the bit pattern from other storage devices in the element or by other techniques.

Each element may have more than one set of electrical contacts and locating features on its surface. The set of electrical contacts used by an element to receive and transmit information from the control unit is called the 'input' to the element.

All other sets of electrical contacts on the surface of the element are potential 'outputs' of the element.

If each element register contains N bits then the control unit may transmit N+M bits. The additional M bits are used as switching information. This switching operation may disconnect or disable the input to this element from its register or some of the electronic devices in the element and instead enable or in other ways connect the input to the element with a selected output of the element.

If there is a second element physically adjacent to this second element such that the set of inputs to the first element is connected to the selected output of the first element, then after the switching operation in the first element the control unit will effectively be in communication with the second element.

The control unit can now proceed to transmit the bit pattern to the second element and recover its identifier.

If no inputs of other elements are connected to the selected output of an element, then a number of alternative conventions may be used to signify this.

These may include:

the bit pattern transmitted by the control unit is received back by the control unit in an unmodified form;

information is transmitted by the control unit but no information is received back by the control unit;

other special transformations are applied to or performed on the bit pattern transmitted by the control unit.

The switches in each element may be reset by either an additional bit pattern transmitted by the control unit, by a separate reset pulse transmitted on a separate conductor line, or by switching the supplies for the electronic devices in the element off and then on again.

While many of the constructional parts required for a model can be provided to scale by suitable shaped elements, other ways of modelling parts can be used. Scale drawings can be prepared and applied to element surfaces to represent a building elevation. Where a modular building technique is in use one or two detailed modules can be formed from one or more elements while the remainder can be provided by outline modules each of which may be the size of several elements. Such multi-element modules although connected to the base board at several places can be arranged to be accessed once to prevent confusion. The temporary register is useful in such cases. For example an unusual set of physical conditions could be written in or the characteristics of a multi element module held on one element. A further extension is to make the element with a semi-permanent register so that each one can be coded specifically, on an auxilliary base board with key board input if needed, for a particular design.

If the modelling arrangement is required to represent behaviour under changing conditions of use or environment the elements can be arranged to respond to control signals by adjusting the values supplied by the parameter register PAR REG or by otherwise interacting with the control console by carrying out mathematical or logical operations with their internal circuitry.

Techniques well known in the data-processing and computing arts may be used to augment the modelling provided by the arrangement described. Files of physical properties can be provided for use by the computer or calculating devices of the control console and evaluation routines can be applied to indicate which changes are most likely to achieve desired improvements. The scale of the elements can be selected to suit the needs of a particular designer. An element can represent a part of a room, a piece of partitioning or furniture, any larger object such as a module of a modular building. Elements can be interconnected and caused to interact in any suitable manner.

The arrangement described above by way of example provides a designer and his client with a most useful aid which by bringing together representational and physical property modelling and converting the model produced to an electrical network greatly improves communication of ideas and requirements between designer and client, thereby ensuring that the client is clearer about the designer's work and its relation to his needs, while the designer can indicate to the client the effect of the client's requirements on the cost and performance of the building or the like. This permits the lay client and the professional designer to more quickly reach decisions and avoid the need for costly design studies which are wasteful of scarce skills and resources. Although described in terms of solid state electronic techniques, clearly other techniques can be used to realise the invention, for example optical or inductive communication and magnetic storage.

I claim:

1. A modelling arrangement of a quantity of changeably interengageable elements, some at least being of forms distinct from others, for selective assembly together, a said element having a distinctive form also including information storage means to store machine readable information identifying the distinctive form, said elements having portions to provide interengagements with other elements and information transfer means effective to transfer stored information from element to element, whereby interengaged elements provide a linked information transfer network for the transfer of machine readable information indicating the arrangement of the interengaged elements.

2. An arrangement according to claim 1 including a control means connected to receive said machine readable information from said linked information transfer network, said control means including a control, store and display unit to record the layout of an assembly into which said elements, in the form of arbitrary shapes such as geometric solids, have been interconnected.

3. A modelling arrangement for providing a visual model of the form of an actual construction and an information network indicative of the collective physical properties of said construction, said modelling arrangement comprising an assembled plurality of changeably interengageable representational elements, each of said elements having a visible form corresponding to a respective actual part of said construction and comprising:
means for storing information pertaining to respective physical properties of the part of said construction represented by a corresponding element;
interrogation responsive means for controllably supplying said stored information; and
means for engaging selected other elements of said modelling arrangement and for linking information paths therebetween, respective visual model portions of said modelling arrangement corresponding to respective actual portions of said construction being defined by groups of engaged elements, and branches of said information network corresponding to respective ones of said groups containing information pertaining to physical properties of the corresponding respective actual portions of said construction being thereby formed by the linkage of said information paths.

4. A modelling arrangement as in claim 3, wherein said means for storing information comprises an information storage circuit having information identifying a corresponding respective actual part of said construction.

5. A modelling arrangement as in claim 3, wherein said means for storing information comprises an information storage circuit having information identifying physical properties of a corresponding respective actual part of said construction.

6. A modelling arrangement as in claim 4 or 5, wherein said information storage circuit comprises manually set switches.

7. A modelling arrangement as in claim 4 or 5, wherein said information storage circuit comprises electronically set switches.

8. A modelling arrangement as in claim 4 or 5, wherein said information storage circuit comprises a microcircuit providing a permanent store of information.

9. A modelling arrangement as in claim 4 or 5, wherein said information storage circuit comprises a temporary storage circuit.

10. A modelling arrangement as in claim 3, wherein each of said elements further includes means for displaying said information.

11. A modelling arrangement as in claim 3, wherein each of said elements further comprises an internal information transfer path connected to said engaging and linking means for transferring information therethrough.

12. A modelling arrangement as in claim 3, wherein a first type of said elements further comprises means responsive to the engagement of another element for indicating said engagement.

13. A modelling arrangement as in claim 3, wherein a first type of said elements is a base module for insertion into a baseboard of said modelling arrangement and a second type of said elements is a visual model module having a visual form indicative of a corresponding actual part of said construction, and wherein:
the information storing means of each base module includes an address register having a unique identifying address for indicating the physical property of location of an actual portion of said construction represented by to a group including a corresponding base module and at least one corresponding visual model module engaged to the corresponding base module and defining therewith a corresponding visual model portion of said modelling arrangement; and
the interrogation responsive means of each base module includes a comparator-interrogator circuit for receiving an interrogation signal, for comparing said interrogation signal with said unique identifying address, and for providing selected information when coincidence therebetween is detected.

14. A modelling arrangement as in claim 3, wherein:

the information storing means of each visual model module includes a register having information indicative of the physical properties of the actual part of said construction represented by a corresponding visual model module; and the interrogation responsive means of each visual model module includes an interrogation detector for receiving a signal from the corresponding base module and for accessing and transmitting said stored information in response thereto.

15. A modelling arrangement as in claim 14, wherein each visual model further includes an interrogation repeater circuit, said interrogation detector responding to a signal from an engaged element received subsequently to accessing and transmitting said stored information, without again accessing and transmitting said stored information, to signal said interrogation repeater circuit and to provide information subsequently received from said interrogation repeater circuit in response thereto; said interrogation repeater circuit receiving the signal from said interrogation detector and subsequently providing information thereto in accordance with a detected one of at least two conditions, said conditions including the absence of another visual model module engaged with said interrogation repeater circuit and the presence of another visual model module engaged with said interrogation repeater circuit.

16. A modelling arrangement as in claim 15, wherein each visual model module further includes a temporary register connected to said information storing means for indicating that the corresponding visual model module has been interrogated without having been subsequently repositioned.

17. A modelling arrangement as in claim 3, wherein said elements include visual model modules, each having a visible form representing a corresponding actual part of said construction, and wherein;

the information storing means of each visual model module includes a register having information indicative of the physical properties of the actual part of said construction represented by the corresponding visual model module; and the interrogation responsive means of each visual model module includes an interrogation detector for receiving an interrogation signal and for accessing and transmitting said stored information.

18. A modelling arrangement as in claim 17, wherein each visual model module further includes an interrogation repeater circuit, said interrogation detector responding to a signal from an engaged element received substantially to accessing and transmitting said stored information, without again accessing and transmitting said stored information, to signal said interrogation repeater circuit and to provide information subsequently received from said interrogation repeater circuit in response thereto; said interrogation repeater circuit receiving the signal from said interrogation detector and subsequently providing information thereto in accordance with a detected one of at least two conditions, said conditions including the absence of another visual model module engaged with said interrogation repeater circuit and the presence of another visual model module engaged with said interrogation repeater circuit.

19. A modelling arrangement as in claim 3 further comprising a baseboard having means for receiving selected elements of said modelling arrangement and for linking respective information paths therebetween in an information transfer relationship.

20. A modelling arrangement as in claim 19, wherein an element received by said baseboard may engage at least one selected other element through said engaging and linking means in an information transfer relationship.

21. A modelling arrangement as in claim 20, wherein said control means further comprises means responsive to changes to said construction specified thereto for determining the collective physical properties of a modified construction represented by said specified changes.

22. A modelling arrangement as in claim 3 further comprising control means, said control means being connected to said groups of engaged elements and selectively generating respective interrogation signals to interrogate said branches respectively, for determining the collective physical properties of said construction represented by said visual model.

23. A modelling apparatus as in claim 22, wherein said control means comprises signal processing means for determining, from the information received from the respective interrogation of said groups of engaged elements, the collective physical properties of said construction represented by said visual model.

24. A changeably interengageable representational element having a visible form representing a corresponding part of an actual construction for use in a modelling arrangement for providing a visual three dimensional model of the form of said construction and an information network indicative of the collective physical properties of said construction, said modelling arrangement comprising an assembled plurality of changeably interengageable representational elements, said element comprising:

means for storing information indicative of respective physical properties of an actual part of said construction represented by the corresponding element;

interrogation responsive means for controllably supplying said stored information; and means for engaging selected other elements of said modelling arrangement and for linking information paths therebetween, assembly of a respective group of engaged elements to form a respective visual model portion of said modelling arrangement representative of an acutal corresponding portion of said construction, and to form a respective branch of said information network for providing information pertaining to physical properties associated with the actual portion of said construction represented by the corresponding visual model portion, being thereby provided for.

25. An element as in claim 24, wherein said means for storing information comprises an information storage circuit having information identifying a corresponding respective actual part of said construction.

26. An element as in claim 24, wherein said means for storing information comprises an information storage circuit having information identifying physical properties of a corresponding respective actual part of said construction.

27. An element as in claim 25 or 26, wherein said information storage circuit comprises manually set switches.

28. An element as in claim 25 or 26, wherein said information storage circuit comprises electronically set switches.

29. An element as in claim 25 or 26, wherein said information storage circuit comprises a microcircuit providing a permanent store of information.

30. An element as in claim 25 or 26, wherein said information storage and retrieval circuit comprises a temporary storage circuit.

31. An element as in claim 24 further comprising means for displaying said information.

32. An element as in claim 24 further comprising an internal information transfer path connected to said engaging and linking means for transferring information therethrough.

33. An element as in claim 24, wherein said element is a base module for inclusion in a baseboard of said modelling arrangement, and wherein:
   said information storing means includes an address register having a unique identifying address for indicating the physical property of location of an actual portion of said construction represented by a group including said base module and at least one corresponding visual model module engaged to said base module and defining therewith a corresponding visual model portion of said modelling arrangement; and
   said interrogation responsive means includes a comparator-interrogator circuit for receiving an interrogation signal, for comparing said interrogation signal with said unique identifying address, and for providing selected information when coincidence therebetween is detected.

34. An element as in claim 24, wherein said element is a visual model module having a visible form indicative of a corresponding actual part of said construction, and wherein:
   said information storing means includes a register having information indicative of the physical properties of the actual part of said construction represented by the corresponding visual model module; and
   said interrogation responsive means includes an interrogation detector for receiving an interrogation signal and for accessing and transmitting said stored information.

35. An element as in claim 24, wherein said visual model module further includes an interrogation repeater circuit, said interrogation detector responding to a signal from an engaged element received subsequently to accessing and transmitting said stored information, without again accessing and transmitting said stored information, to signal said interrogation repeater circuit and to provide information subsequently received from said interrogation repeater circuit in response thereto; said interrogation repeater circuit receiving the signal from said interrogation detector and subsequently providing information thereto in accordance with a detected one of at least two conditions, said conditions including the absence of another visual model module engaged with said interrogation repeater circuit and the presence of another visual model module engaged with said interrogation repeater circuit.

36. An element as in claim 35, wherein said visual model module further includes a temporary register connected to said information storing means for indicating that the visual model module has been interrogated without having been subsequently repositioned.

37. A method for providing a modelling arrangement of the form of an actual construction and an information network indicative of the collective physical properties of said construction, comprising the steps of:
   assembling a plurality of changeably interengageable representational elements into respective visual model portion representative of corresponding actual portions of said construction, each of said elements containing information pertaining to physical properties of a corresponding actual part of said construction, and branches of an information network corresponding to respective ones of the actual portions of said construction being thereby formed;
   interrogating said visual model portions, said visual model portions thereby responding with information pertaining to physical properties of the respective corresponding actual portions of said construction in accordance with corresponding respective branches;
   creating an electonic representation of the physical properties of said construction, represented by the assembled elements, from the results of said interrogating step; and
   analyzing the performance characteristics of said construction represented by the assembled elements.

38. A method as in claim 37 further comprising the steps of:
   displaying the physical properties of said construction;
   modifying the physical properties of said construction directly to obtain physical properties of a modified construction; and
   analyzing the performance characteristics of said modified construction.

39. A method as in claim 37, wherein said elements include base modules and visual model modules, and wherein said assembling step comprises the steps of:
   selecting a base module having a predetermined position on a baseboard to site a respective visual model portion; and
   constructing a respective visual model portion above said selected base module, respective visual model modules having a visual form indicative of a corresponding part of said construction being thereby engaged.

40. A method as in claim 39, wherein said interrogating step comprises the steps of:
   providing a location interrogation signal, a respective one of said base modules being responsive thereto by indicating at least one of two conditions, said conditions being an absence of a corresponding visual model portion constructed thereabove, and the presence of a corresponding visual model portion constructed thereabove as indicated by at least information pertaining to physical properties of the actual portion of said construction represented by the corresponding visual model portion in accordance with information stored in the corresponding branch; and
   receiving the indication of at least one of two conditions.

* * * * *